United States Patent [19]
Ono

[11] Patent Number: 6,087,895
[45] Date of Patent: *Jul. 11, 2000

[54] SEMICONDUCTOR INTEGRATED CIRCUIT HAVING POWER LINES SEPARATELY ROUTED TO INPUT CIRCUITS AND CIRCUIT UNIT USING IT

[75] Inventor: Masaaki Ono, Kawasaki, Japan

[73] Assignee: Fujitsu Limited, Kanagawa, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/790,930

[22] Filed: Jan. 29, 1997

[30] Foreign Application Priority Data

| Feb. 8, 1996 | [JP] | Japan | 8-022361 |
| Dec. 5, 1996 | [JP] | Japan | 8-325143 |

[51] Int. Cl.[7] ................................. H01L 25/00
[52] U.S. Cl. ........................................ 327/565
[58] Field of Search ............................ 327/564, 565, 327/566

[56] References Cited

U.S. PATENT DOCUMENTS

| 3,643,609 | 2/1972 | Maywald et al. | 327/525 |
| 4,656,370 | 4/1987 | Kanuma | 327/565 |
| 4,789,812 | 12/1988 | Nakamura | 318/567 |
| 5,274,280 | 12/1993 | Ito et al. | 327/70 |
| 5,668,551 | 9/1997 | Garavan et al. | 341/120 |

FOREIGN PATENT DOCUMENTS 5-128855 5/1993 Japan .

OTHER PUBLICATIONS

Baifukan, "Super LSI Memory", 1994, p. 270. (Japanese Language Reference).

*Primary Examiner*—Terry D. Cunningham
*Attorney, Agent, or Firm*—Arent, Fox, Kintner, Plotkin & Kahn

[57] ABSTRACT

A semiconductor integrated circuit capable of preventing propagation of noise from an output circuit to an input circuit and limiting inflow of a current caused by a protective circuit for protecting the input circuit has been disclosed. In a semiconductor integrated circuit including an input circuit 11, other circuits 12 and 13 that operate according to an output of the input circuit 11, and a plurality of power supply pins 16, 17, 18, and 19 through which a supply voltage is supplied to the input circuit 11 and other circuits 12 and 13 and to which the same supply voltage is applied, input circuit power lines 20 and 22 over which power is supplied to at least part of the input circuit 11 and general power lines 21 and 23 over which power is supplied to other circuits 12 and 13 are separated from each other. The input circuit power lines 20 and 22 and general power lines 21 and 23 are coupled to different power supply pins 16, 17, 18, and 19.

17 Claims, 18 Drawing Sheets

SEMICONDUCTOR INTEGRATED CIRCUIT HAVING POWER LINES SEPARATELY ROUTED TO INPUT CIRCUITS AND CIRCUIT UNIT USING IT

BACKGROUND OF THE INVENTION

1. Field of the Invention

The present invention relates to a semiconductor integrated circuit and a circuit unit using it. More particularly, this invention is concerned with routing of power lines within a semiconductor chip mounted in an IC package.

2. Description of the Related Art

In recent years, semiconductor large-scale integration (hereinafter LSI) has inclined toward an increase in the numbers of input and output pins or the number of power supply pins due to the trend of semiconductor circuits toward high integration and high circuit density. Moreover, there is the trend toward a decrease in supply voltage for the purpose of ensuring reliability of LSIs or achieving lower power consumption. Taking for instance a known LSI unit using a transistor-transistor logic (TTL) that includes bipolar transistors, 5 V is often used for driving. In the case of an LSI unit using field-effect transistors, driving with a voltage ranging from 3 V to 3.3 V is becoming a mainstream. However, in an LSI unit intended to achieve low-voltage driving, even a small noise may cause a transistor to malfunction. A countermeasure is demanded.

In a highly-integrated LSI, since sufficient power supply cannot be achieved with one pair of power supply pins, the number of power supply pins is increased. This is because a power pin and internal line are coupled to each other over a thin bonding wire, and the capacity of one bonding wire for conducting electricity is limited. Circuits included in an LSI are broadly divided into an input circuit, internal circuit, and output circuit. A plurality of power supply pins are coupled to common power lines within the LSI, and power is supplied to the circuits over the common power lines. When an LSI is actually mounted on a printed-circuit board or the like, power supply pins are coupled to common power supply located outside a package. Owing to this routing of power lines, ample power can be supplied to the circuits within the LSI. However, once an output signal of the output circuit varies, a power noise occurs on an internal power line accordingly. The power noise propagates to the input circuit and internal circuit along the common power route, and causes these circuits to malfunction. In recent years, the numbers of signal input and output pins have increased. This has become a significant problem because an increase in the number of output circuits leads to a larger power noise. Furthermore, the operating speed of LSIs is getting higher along with the upgrade of the performance of LSIs. This facilitates occurrence of a noise due to simultaneous switching of output circuits. For solving these problems and operating an LSI normally, the influence of simultaneous switching upon the LSI must be minimized or the durability of the LSI against a noise must be improved.

For solving the foregoing problems, in a known LSI, power pins and power lines within the LSI are provided separately for output circuits and other circuits. Owing to this configuration, a power noise caused by simultaneous switching of the output circuits does not directly affect input circuits and internal circuits. Consequently, the influence of the simultaneous switching upon the LSI can be minimized. However, according to the method of separating power lines within an LSI chip, since one pair of power lines is used exclusively for the output circuits, the ability to supply a current onto the power lines deteriorates compared with that attained when power lines are not separated. This poses the first problem that the operating power for the output circuits and internal circuits becomes less ample because of the separation.

An LSI has diodes for preventing electrostatic breakdown, that is, a protective circuit connected on an input signal line. The diodes function to remove abnormal charge accumulated in an input pin connected to an input circuit onto a power line and ground line.

As mentioned above, the recent trend of an LSI is a decrease in supply voltage. In addition to known LSIs to be driven with 5 V, numerous LSIs to be driven with a voltage ranging from 3 V to 3.3 V have come to be utilized. For a main printed-circuit board for a personal computer, workstation, or the like, it may be necessary to use both the LSIs to be driven with 5 V and the LSIs to be driven with a voltage ranging from 3 V to 3.3 V. This brings about a situation in which LSIs to be driven with different supply voltages coexist and the output pins of the LSIs are interconnected. Moreover, an emitter-coupled logic (ECL) device has been used as a device that operates at a high speed in the past. ECL devices and TTL devices have been used in combination. In an input circuit within an LSI to be driven with a lower supply voltage which has this kind of configuration, if an output signal sent from an LSI to be driven with a higher supply voltage becomes higher or lower than the lower supply voltage, a current flows onto power lines via diodes. Thus, the input circuit is protected. However, this poses the second problem that the excessive current flowing via the diodes that are designed to protect the input circuit may break down the diodes constituting a protective circuit and the input circuit within the LSI, and that since an output circuit within the LSI to be driven with the higher supply voltage causes a large current to flow, an excess load is imposed on a high-voltage power line routed to the output circuit.

SUMMARY OF THE INVENTION

The present invention attempts to solve the foregoing problems. An object of the present invention is to provide a semiconductor integrated circuit capable of preventing propagation of a noise from an output circuit to an input circuit, and limiting inflow of a current caused by a protective circuit for protecting the input circuit.

A semiconductor integrated circuit of the present invention comprises an input circuit, other circuits that operate according to an output of the input circuit, and a plurality of power supply pins through which a supply voltage is supplied to the input circuit and other circuits and to which the same voltage is applied. In the semiconductor integrated circuit, input circuit power lines through which power is supplied to at least part of the input circuit and general power lines through which power is supplied to other circuits are separated from each other. The input circuit power lines and general power lines are coupled to different power supply pins.

Some circuits included in the input circuit may be connected on the input circuit power lines, and the other circuits may be connected on the general power lines. Moreover, either high-potential lines or low-potential lines of the input circuit power lines and general power lines may be separated from each other, and the other lines may be provided as a common line. Furthermore, preferably, two power supply pins to which the high-potential power line and low-potential power line of the input circuit power lines are coupled are arranged at both sides of a pin coupled to an input signal line.

In a semiconductor integrated circuit of the present invention, since the power lines for input circuits are separated from those for other circuits, noise stemming from other circuits can be prevented, for example, noise caused by simultaneous switching of output circuits, which is a problem encountered with a prior art, propagates directly to the input circuits over the power lines. By this, malfunctions of the input circuits and malfunctions of LSIs having these input circuits can be prevented. The malfunction is often attributable to the influence of noise, caused by simultaneous switching of output circuits upon input circuits. It is therefore effective that the power lines for input circuits are separated from those for other circuits as they are in the present invention. The prior art in which the power lines for input circuits and internal circuits are separated from those for output circuits can prevent a noise caused by simultaneous switching of the output circuits from affecting the input circuits. However, the prior art cannot prevent a noise caused by the internal circuits from affecting the input circuits. Besides, since an internal circuit needs a large current, the power lines routed to the internal circuits should be reinforced. From this viewpoint, the configuration of the present invention in which the internal circuits and output circuits share the same power lines is preferable. When a plurality of input circuits are included, power lines for some of the input circuits susceptible to noise may be separated from those for the other input circuits. The same advantage as the foregoing one can still be provided.

Moreover, when a current limiting circuit is connected between a power supply pin coupled to an input circuit power line and a power supply, a current flowing from an output circuit within an LSI, which is driven with a high voltage, onto a power line within an LSI, which is driven with a low voltage, via one of diodes constituting a protective circuit is limited. Breakdown of a circuit or power supply can therefore be avoided. Connection of the current limiting circuit is enabled because the power lines and power supply pins for an input circuit are separated from those for other circuits according to the present invention. Since the input circuit requires a small current consumption, once the impedance of the current limiting circuit is made sufficiently low, even if the current limiting circuit is connected, a voltage drop occurring in the current limiting circuit is so small as to pose no problem in practice. The operation of the input circuit will not be affected adversely. However, when the input circuit shares the same power lines with an internal circuit consuming a large current and an output circuit according to the prior art, even if a current limiting circuit offering the same impedance as the above current limiting circuit is used, a voltage drop occurring in the current limiting circuit becomes too large to be ignored. This not only adversely affects the operation of the input circuit but also poses a problem that a power consumption increases because power is consumed by the current limiting circuit. Thus, using a semiconductor integrated circuit of the present invention having the power lines routed separately to an input circuit and including a protective circuit, once a current limiting circuit is connected outside the package, inflow of a current caused by the protective circuit can be limited.

BRIEF DESCRIPTION OF THE DRAWINGS

The present invention will be more clearly understood from the description as set below with reference being made to the accompanying drawings, wherein.

DESCRIPTION OF THE PREFERRED EMBODIMENTS

Before preceding to a detailed description of the preferred embodiments of the present invention, a prior art LSI will be described with reference being made to the accompanying drawings relating thereto for a clearer understanding of the differences between the prior art and the present invention.

Figure 1:
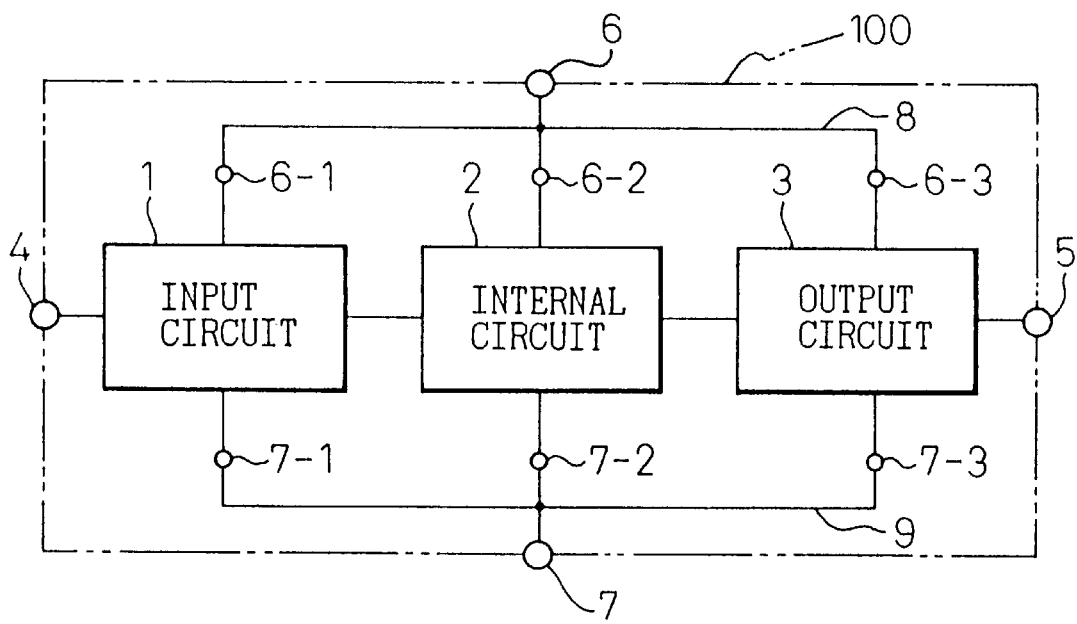
FIG. 1 is a diagram showing the configuration of a known semiconductor integrated circuit.

FIG. 1 is a diagram showing a LSI unit in accordance with a prior art. An illustrated LSI 100 includes an input circuit 1 for fetching an input signal input through a signal input pin 4 into the LSI, an internal circuit 2 that operates according to an output of the input circuit 1, and an output circuit 3 for outputting an output of the internal circuit 2 through a signal output pin 5. A supply voltage necessary for the circuits to operate is supplied through a high-potential power supply pin 6 and low-potential power supply pin 7. Also shown in FIG. 1 are a high-potential power line 8 over which the high-potential power supply pin 6 is connected to the circuits, a low-potential power supply line 9 over which the low-potential power supply pin 7 is connected to the circuits, nodes 6-1, 6-2, and 6-3 between the high-potential power supply line 8 and the circuits, and nodes 7-1, 7-2, and 7-3 between the low-potential power supply line 9 and the circuits. Herein, one signal input pin 4 and one signal output pin 5 are shown. In reality, pluralities of signal input pins and signal output pins are generally included. Likewise, one high-potential power supply pin 6 and one low-potential power supply pin 7 are shown. In a highly-integrated LSI, since one pair of power supply pins cannot ensure sufficient power supply, the number of power supply pins is increased. Normally, the pins and internal lines are coupled by way of thin bonding wires. This is because the capacity of one bonding wire for conducting electricity is limited.

Figure 2:
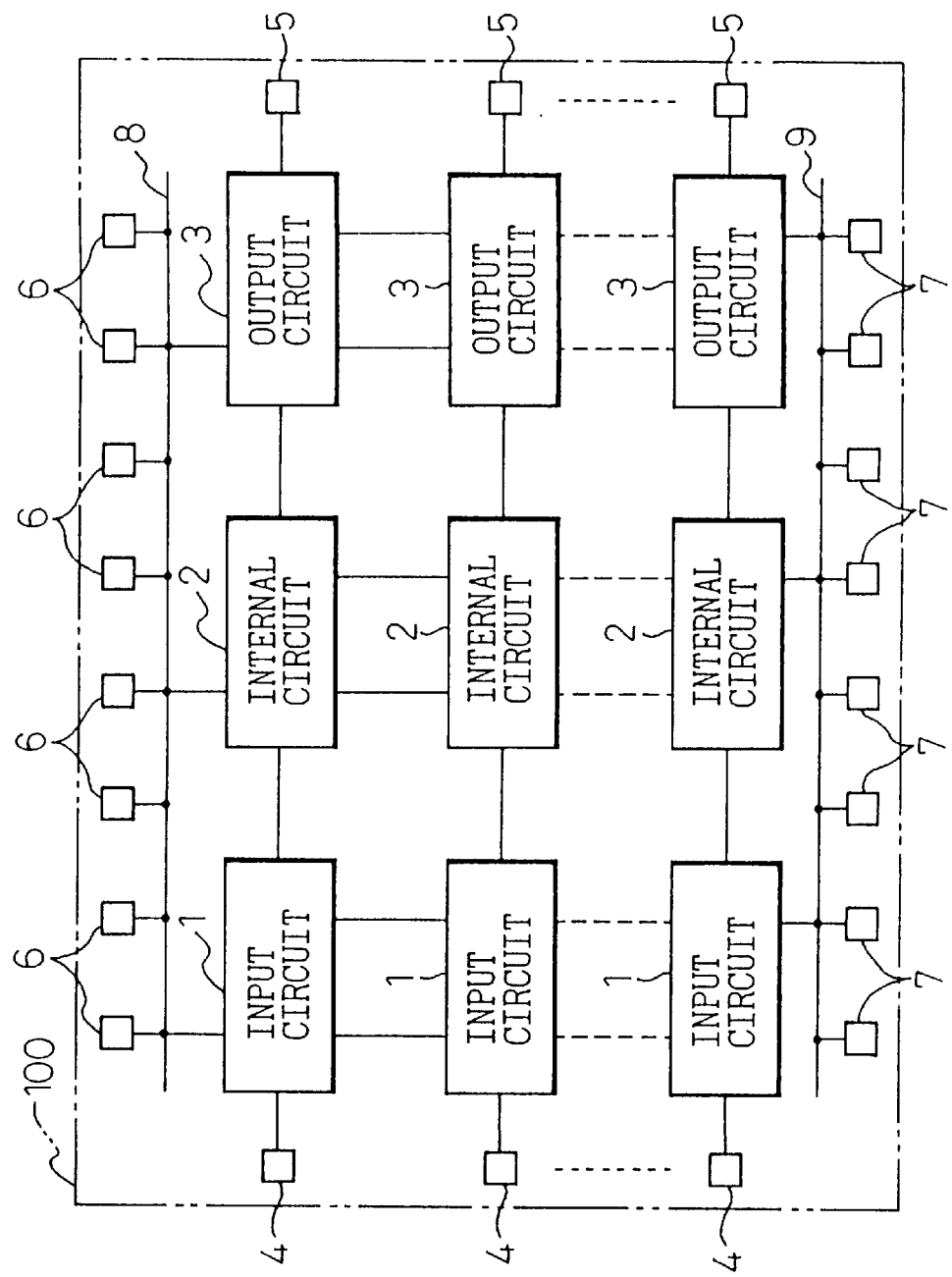
FIG. 2 is a diagram showing the configuration of a prior art of a semiconductor integrated circuit having a plurality of power supply pins.

FIG. 2 is a diagram of the configuration of an LSI unit in accordance with a prior art in which pluralities of circuits and pins are included. As illustrated, pluralities of signal input pins 4 and signal output pins 5 are included. The same numbers of input circuits 1 and output circuits 3 as the numbers of signal input pins 4 and signal output pins 5 respectively are included. Moreover, an internal circuit 2 is actually a set of numerous circuits designed for achieving given functions. Herein, the internal circuit 2 is shown as one circuit for convenience' sake. The plurality of circuits constituting one internal circuit 2 usually receive output signals sent from a plurality of input circuits 1. An actual configuration is therefore not as simple as the illustrated one. The required current capacity of an input circuit 1 is smaller than those of an internal circuit 2 and output circuit 3.

Pluralities of high-potential power supply pins 6 and low-potential power supply pins 7 are included. The high-potential power supply pins 6 are coupled in common to the high-potential power line 8, and the low-potential power supply pins 7 are coupled in common to the low-potential power line 9. Supply of a supply voltage to the circuits is achieved by way of the high-potential power line 8 and low-potential power line 9. In the drawing, the number of high-potential power supply pins 6 is eight. The high-potential power supply pins 6 are attached to eight electrode pads formed on the high-potential power line 8 by way of bonding wires. The low-potential power supply pins 7 are pins to be grounded, and the number of low-potential power supply pins 7 is eight. The low-potential power supply pins 7 are attached to eight electrode pads formed on the low-potential power line 9 that is a ground line by way of bonding wires. Thus, the internal power lines are coupled to a plurality of power pins by way of a plurality of bonding wires. This results in an increase in total amount of current to be supplied to the internal power lines.

When the foregoing LSI is actually mounted on a printed-circuit board or the like, the eight high-potential power supply pins 6 are connected in common to a high-potential power supply outside the package, and the eight low-potential power supply pins 7 are connected in common to a low-potential power supply. According to this kind of routing of power lines, ample power can be supplied to the input circuits 1, internal circuits 2, and output circuits 3 over the common power lines 8 and 9. However, when the output signals of the plurality of output circuits 3 vary simultaneously, power noise occurs on the internal power lines accordingly. The power noise propagates to the input circuits 1 and internal circuits 2 over the common power lines 8 and 9, thus causing the circuits to malfunction. In recent years, the numbers of signal input and output pins have been increasing. This has become a significant problem because an increase in the number of output circuits leads to a larger power noise. Moreover, the operating speed of an LSI is getting higher along with the upgrade of the performance of the LSI. This facilitates occurrence of a noise due to simultaneous switching of output circuits. For solving these problems and operating an LSI normally, the influence of the simultaneous switching upon the LSI must be minimized or the durability of the LSI against a noise must be improved.

Figure 3:
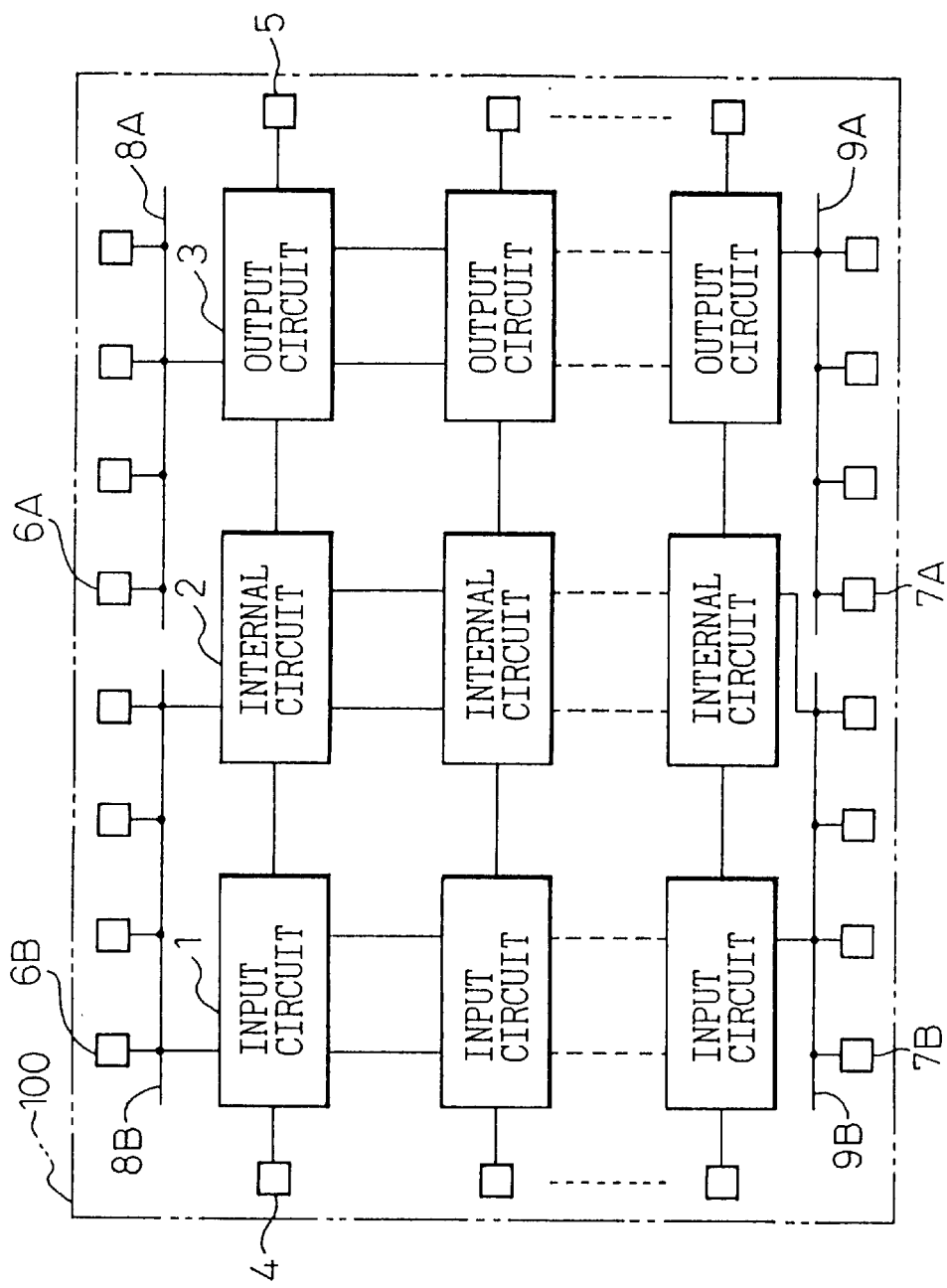
FIG. 3 is a diagram showing the configuration of a prior art of a semiconductor integrated circuit having power supply pins for an output circuit separately for the purpose of minimizing the influence of a noise occurring in the output circuit upon input circuits.

FIG. 3 is a diagram showing the configuration of a prior art of a semiconductor integrated circuit in which measures have been taken for solving the foregoing problems. As is apparent from comparison with FIG. 2, in FIG. 3, the high-potential power line 8 is divided into two high-potential power lines 8A and 8B, and the low-potential power line 9 is divided into two low-potential power lines 9A and 9B. The high-potential power line 8A is coupled to high-potential power supply pins 6A and output circuits 3, while the high-potential power line 8B is coupled to high-potential power supply pins 6B as well as input circuits 1 and internal circuits 2. A low-potential power line 9A is coupled to low-potential power supply pins 7A and the output circuits 3, while a low-potential power line 9B is coupled to low-potential power supply pins 7B as well as the input circuits 1 and internal circuits 2. When a circuit unit is constructed using the IC, the eight high-potential power supply pins 6A and 6B are connected in common to a high-potential power supply outside the package, while the eight low-potential power supply pins 7A and 7B are connected in common to a low-potential power supply. Owing to this configuration, a power noise occurring on the high-potential power line 8A and low-potential power line 9A due to simultaneous switching of the output circuits does not directly affect the high-potential power line 8B and low-potential power line 9B coupled to the input circuits 1 and internal circuits 2. Consequently, the influence of the simultaneous switching upon the LSI can be minimized.

As mentioned above, the recent trend of an LSI is a decrease in supply voltage. In addition to existing LSIs to be driven with 5 V, numerous LSIs to be driven with a voltage ranging from 3 V to 3.3 V have been put to use. For a main printed-circuit board for a personal computer, workstation, or the like, both the LSIs to be driven with 5 V and the LSIs to be driven with a voltage ranging from 3 V to 3.3 V must be used in combination. This brings about a situation that LSIs to be driven with different supply voltages coexist and the output pins of the LSIs are interconnected. An emitter-coupled logic (ECL) device has been used as a device that operates at a high speed in the past. ECL devices and TTL devices have been used in combination.

Figure 4:
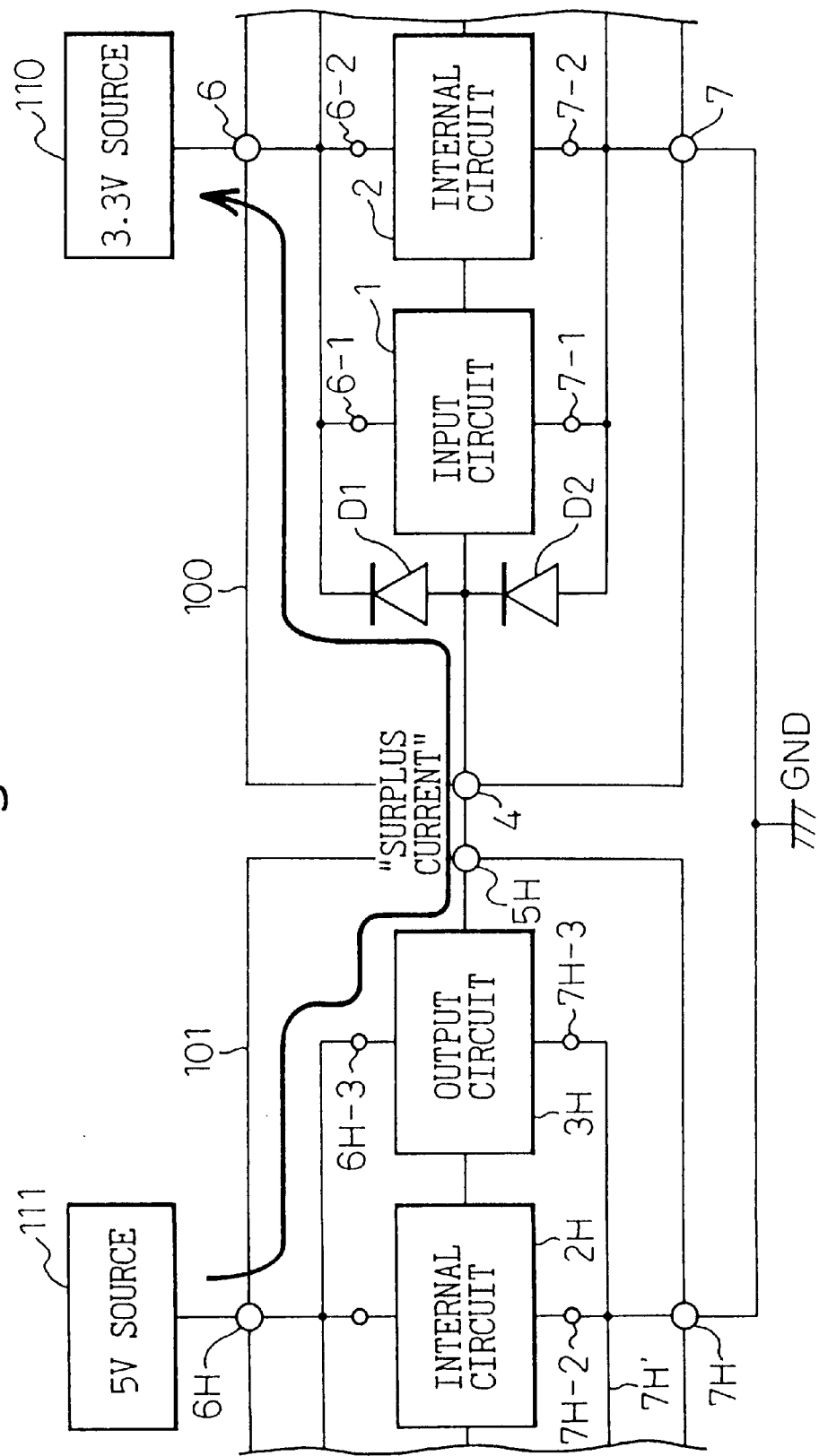
FIG. 4 is a diagram for explaining a problem occurring when a device is connected to another device to be driven with a different voltage.

FIG. 4 shows an example of a circuit made by connecting a 5 V-driven device and 3 V-driven device. In FIG. 4, there are shown an LSI 100 to be driven with 3.3 V and an LSI 101 to be driven with 5 V. For example, a signal whose level corresponds to a level defined in the 3.3 V-driven LSI 100 is output through a signal output pin 5H of the 5 V-driven LSI 101, and input to the LSI 101 through a signal input pin 4. A high-potential power supply pin 6 of the LSI 100 is connected to a 3.3 V source 110, while a high-potential power supply pin 6H of the LSI 101 is connected to a 5 V source 111. Low-potential power supply pins 7 and 7H of the LSIs 100 and 101 are coupled to a common ground line GND. Also shown are diodes (protective circuit) D1 and D2, for preventing electrostatic breakdown, which are connected to an input circuit 1 in the 3.3 V-driven device 110. The diodes D1 and D2 function to expel abnormal charges accumulated in an input pin connected to the input circuit 1 into the 3.3 V source 110, the power line connected to the 3.3 V source, or the ground line GND. Consequently, electrostatic breakdown of the input circuit 1 can be prevented. An output signal output from the LSI 101 through the signal output pin 5H has an intermediate level between 3.3 V and 0 V corresponding to the logic levels defined in the LSI 100. When the output signal exceeds 3.3 V, a current flows into the 3.3 V source 110 via the diode D1. When the output signal becomes a negative voltage equal to or smaller than 0 V, a current flows onto the ground line GND via the diode D2. Thus, the input circuit 1 and others are protected.

According to the method for separating power lines within a semiconductor chip (when power supply pins are divided in fours), since the power line 8A is used exclusively for the output circuits, the ability to supply a current onto the power line 8B is halved compared with the one obtained when the power lines are not separated. This disables the internal circuits 2 from receiving a current by way of the power lines 8A and 9A. The operating power for the internal circuits 2 becomes less ample.

In the circuit shown in FIG. 4, since the potential at the high-potential power line is higher than the potential of an input signal, the diode D1 is normally reversely biased and remains OFF. However, if the 3.3 V source 110 is turned OFF for some reason, a potential difference exceeds a forward voltage VF (about 0.8 V), and the diode D1 is turned ON. This causes an output signal of the 5 V-driven device 101 to pass through the diode D1, whereby a surplus current flows over the high-potential power line in the 3.3 V-driven LSI 100 and a power line coupled to the 3.3 V source 110. This surplus current breaks down the diode D1 serving as a component of a protective circuit and the input circuit 1 within the LSI 100. Since an output circuit 3H causes a large current to flow, a larger current is supplied from the 5 V source 111. An excess load is therefore imposed on the 5 V source 111.

Figure 5:
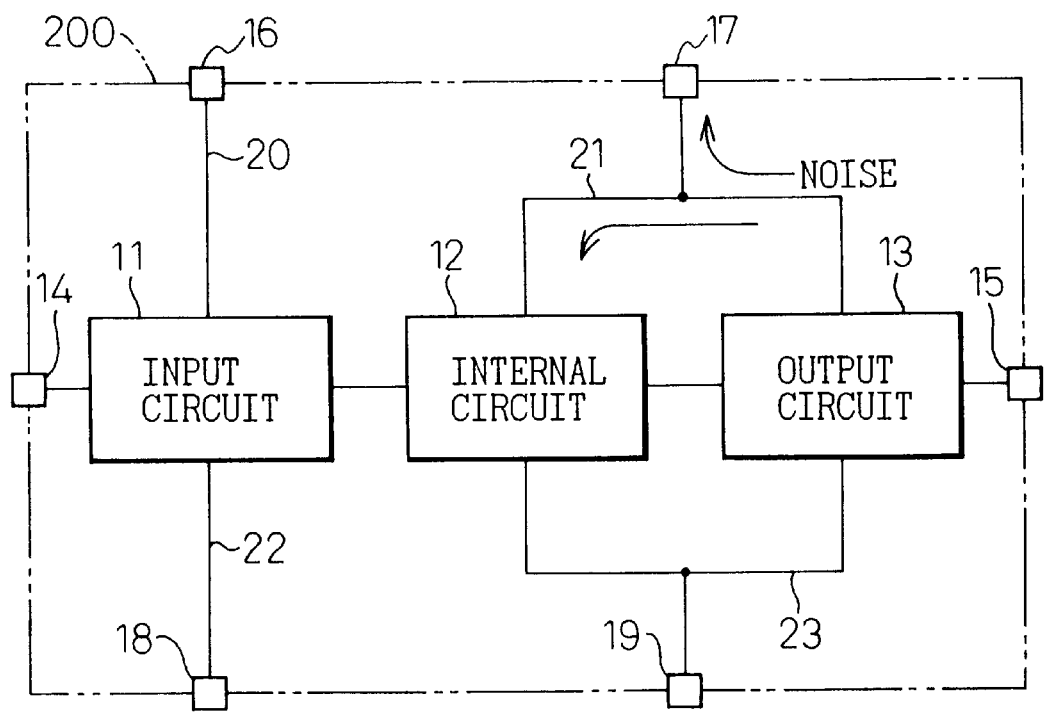
FIG. 5 is a diagram showing the principles and configuration of a semiconductor integrated circuit in accordance with the present invention.

FIG. 5 shows the principles and configuration of a semiconductor integrated circuit of the present invention. In FIG. 5, there are shown an input circuit 11, an internal circuit 12, an output circuit 13, a signal input pin 14, a signal output pin 15, high-potential power supply pins 16 and 17, low-potential power supply pins 18 and 19, a high-potential power line 20 linking the high-potential power supply pin 16 to the input circuit 11, a high-potential power line 21 linking the high-potential power supply pin 17 to the internal circuit 12 and output circuit 13, a low-potential power line 22 linking the low-potential power supply pin 18 to the input circuit 11, a low-potential power line 23 linking the low-potential power supply pin 19 to the internal circuit 12 and output circuit 13, and a semiconductor integrated circuit 200. In the semiconductor integrated circuit 200 of the present invention, for accomplishing the aforesaid object, the power lines 20 and 22 over which power is supplied to the input circuit 11 are separated from the power lines 22 and 23 over which power is supplied to the other circuits 12 and 13 that operate according to an output of the input circuit.

In other words, the semiconductor integrated circuit of the present invention is a semiconductor integrated circuit comprising the input circuit 11, other circuits 12 and 13 that operate according to an output of the input circuit, a plurality of power supply pins 16, 17, 18, and 19 over which a supply voltage is supplied to the input circuit 12 and other circuits 12 and 13 and to which the same voltage is applied. The semiconductor integrated circuit is characterized in that: the input circuit power lines 20 and 22 over which power is supplied to at least part of the input circuit 12 are separated from the general power lines 21 and 23 over which power is supplied to other circuits 12 and 13; and the input circuit power lines 20 and 22 and the general power lines 21 and 23 are coupled to the different power supply pins 16 and 18, and 17 and 19.

Figure 6:
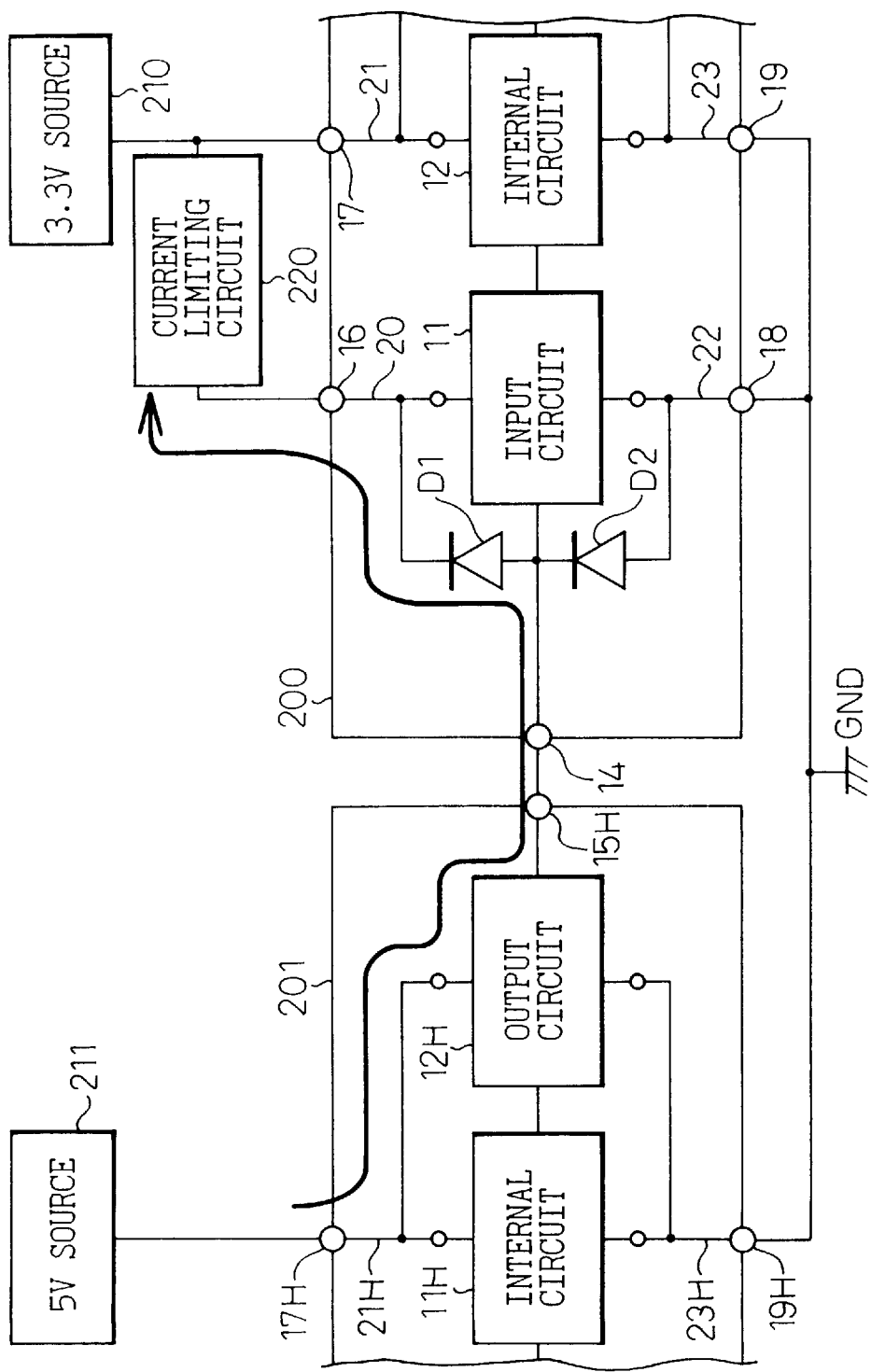
FIG. 6 is an explanatory diagram concerning a usage of the semiconductor integrated circuit of the present invention.

FIG. 6 is a diagram showing the configuration in which a semiconductor integrated circuit having diodes D1 and D2 connected as a protective circuit between an input signal line routed to an input circuit 11 and input circuit power lines. A current limiting circuit 220 is connected between a high-potential power supply pin 16 to which an input circuit power line 20 is coupled and a first voltage source (3.3 V source).

As shown in FIG. 6, since the current limiting circuit 220 is connected between the high-potential power supply pin 16 to which the input circuit power line 20 is coupled and the 3.3 V source 210 that is a power supply source, even if the 3.3 V source is turned OFF and a surplus current flows from a 5 V-driven circuit into a 3.3 V-driven circuit, the current is limited by the current limiting circuit 220. Breakdown of the 3.3 V-driven circuit, 5 V-driven circuit, and voltage sources can be avoided. Connection of the current limiting circuit 220 is enabled because the power lines and power pins for the input circuit 11 are separated from those for other circuits according to the present invention. Since an input circuit requires a small current consumption, once the impedance of the current limiting circuit 220 is reduced sufficiently, even if the current limiting circuit 220 is connected, a voltage drop occurring in the current limiting circuit is so small as to pose no problem in practice. The operation of the input circuit will not be affected adversely. However, when, as in the input circuits in the prior art shown in FIG. 3, an input circuit shares power lines with an internal circuit consuming a large current and an output circuit, even if a current limiting circuit offering the same impedance as the current limiting circuit 220 is used, the voltage drop occurring in the current limiting circuit becomes too large to be ignore. This not only adversely affects the operation of the input circuit but also poses a problem that a power consumption increases because power is consumed by the current limiting circuit. By contrast, using the semiconductor integrated circuit of the present invention having the power lines routed separately to the input circuit and including the protective circuit, once the current limiting circuit 220 is connected outside the package, inflow of a current caused by the protective circuit can be limited.

Figure 7:
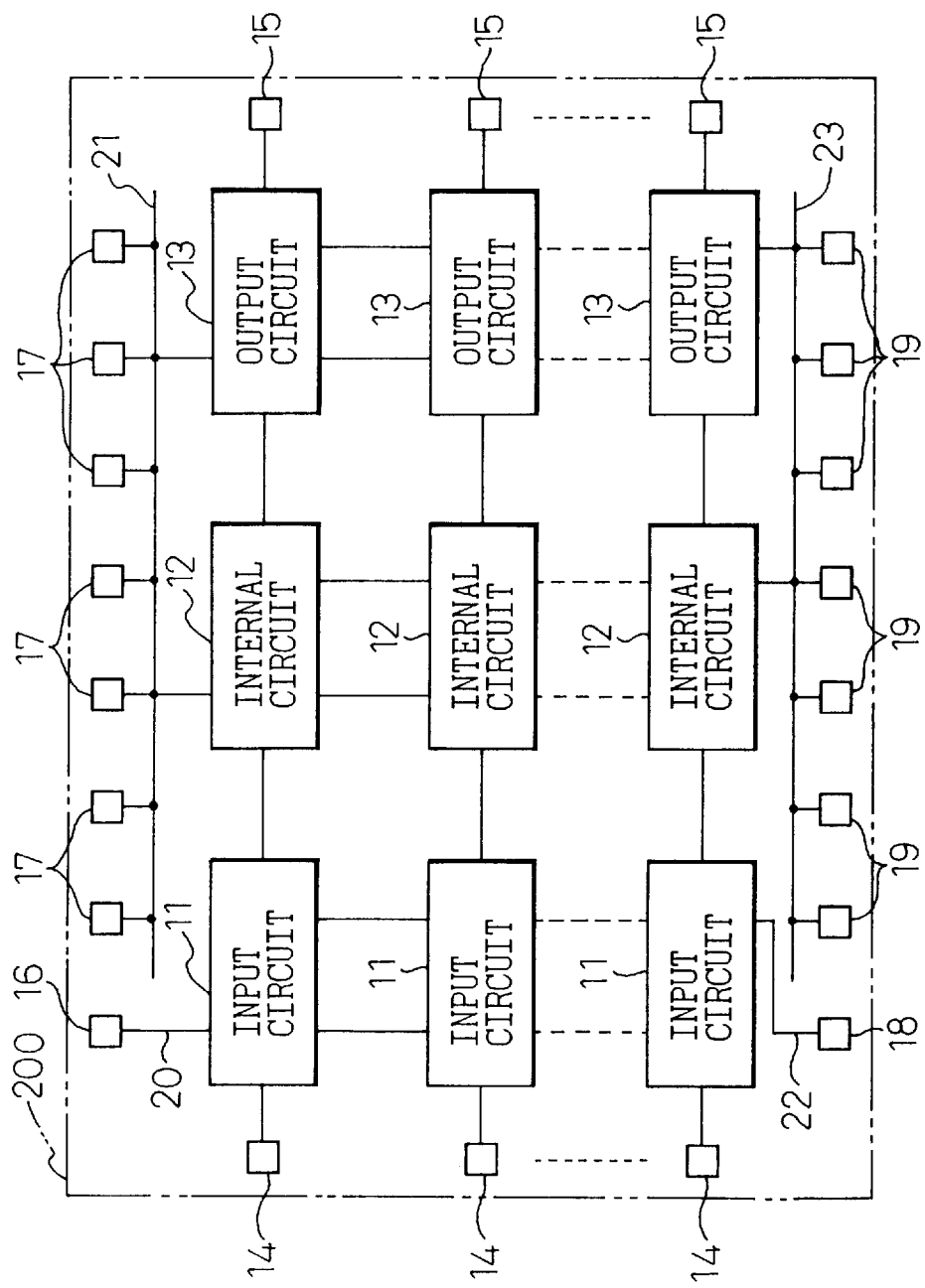
FIG. 7 is a diagram showing the configuration of a semiconductor integrated circuit of the first embodiment of the present invention.

FIG. 7 shows the configuration of a semiconductor integrated circuit (IC) of the first embodiment of the present invention. As shown in FIG. 7, in an IC 200 of the first embodiment of the present invention, input signals input externally through signal input pins 14 are fetched into the IC by input circuits 11. Internal circuits 12 carry out processing in line with the signals fetched by the input circuits 11. Signals that are the results of the processing are output from output circuits 13 through signal output pins 15 to outside. Each input circuit 11 includes a TTL that has CMOS transistors combined and operates with a signal representing a TTL level, and an ECL that has bipolar transistors combined and operates with a signal representing an ECL level. The TTL is of a type of logic circuit that operates with a voltage that is set relative to a threshold voltage used as a reference, while the ECL is of a type of logic circuit that is driven with a base current. There are the same number of pairs of a signal input pin 14 and input circuit 11 as the number of input signals. There are the same number of pairs of an output circuit 13 and signal output pin 15 as the number of output signals. Moreover, each internal circuit 12 is composed of a plurality of circuits. Generally, one internal circuit 12 receives output signals from a plurality of input circuits 11. The actual configuration is therefore not as simple as the illustrated one. Also shown are high-potential power supply pins 16 and 17, and low-potential power supply pins 18 and 19. The numbers of the high-potential power supply pins and low-potential power supply pins are eight. Power supply to the input circuits 11 is achieved by way of an input circuit power line 20 coupled to one high-potential power supply pin 16 and an input circuit power line 22 coupled to one low-potential power supply pin 18. An input circuit 11 requires a smaller driving current than an internal circuit 12 and output circuit 13. The power supply pin 16 can therefore be shared by a plurality of input circuits. Power supply to the internal circuits 12 and output circuits 13 is achieved by way of general power lines 21 and 23. The general power line 21 is attached to pads that are not shown. The pads are joined with the seven high-potential power supply pins 17 by way of bonding wires. The general power line 23 is attached to pads that are not shown. The pads are joined with the seven low-potential power supply pins 19 by way of bonding wires. Thus, currents can be supplied to the internal circuits 12 and output circuits 13 within the capacities of seven wires for conducting electricity.

Figure 8:
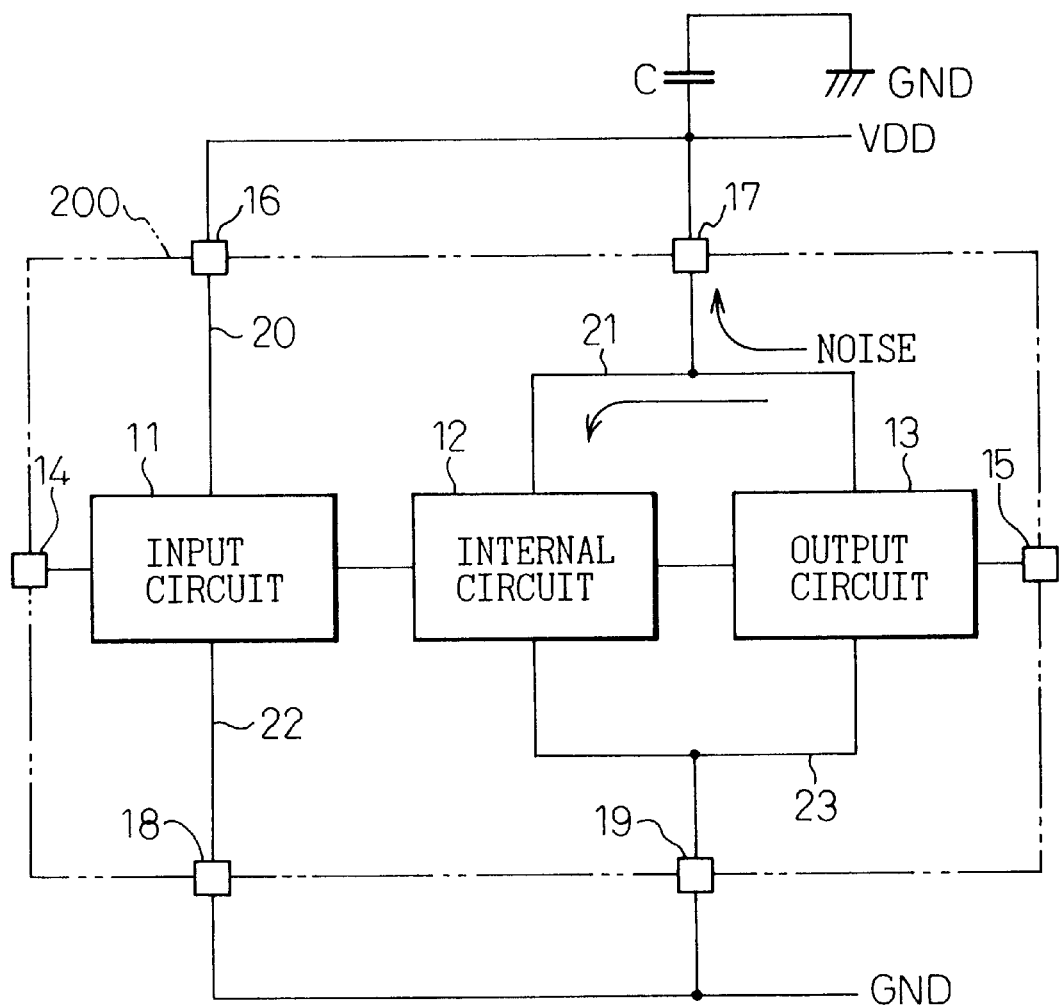
FIG. 8 is a diagram showing an example of power supply from outside to the semiconductor integrated circuit of the first embodiment.

Next, referring to FIG. 8, a method of supplying power to an IC of this embodiment will be described. In FIG. 8, for convenience' sake, one combination of an input circuit 11, internal circuit 12, and output circuit 13 is extracted from the IC 200. For discontinuing propagation of a noise occurring in the output circuit 13, the input circuit power lines and output circuit power lines should preferably be fully separated from each other. Normally, however, the full separation is not achieved because of the cost of power supply facilities.

In this embodiment, on a printed-circuit board on which the IC 200 is mounted, the high-potential power supply pin 16 for input circuits and the high-potential power supply pins 17 for internal circuits and output circuits are coupled to a common external high-potential power line VDD. The low-potential power supply pin (ground pin) for the input circuits 18 and the ground pins 19 for the internal circuits and output circuits are coupled to a common external ground line GND. Preferably, a capacitive device C is connected between the external power line VDD and an external ground line GND. When the output circuits 13 generate a noise due to simultaneous switching, the capacitive device C functions to remove the noise.

As mentioned above, in the IC of the first embodiment of the present invention, the power line 21 for the internal circuits 12 and output circuits 13 is separated from the power line 20 for the input circuits 11. It can be prevented that a noise caused by the output circuits 13 propagates from the output circuits 13 directly to the input circuits 11. In the first embodiment, for example, the propagation route of a noise over a high-potential power line is from the output circuits 13 through the power line 21, power supply pins 17, external power line VDD, power supply pin 16, and power line 20 to the input circuits 11. The noise propagation route is longer than the one formed when power is distributed within a package, that is, when a noise is propagated from the output circuits 13 directly to the input circuits 11 over the internal power line according to the prior art. Consequently, the noise is reduced by the resistances of the power supply pins 16 and 17 constituting the propagation route and an electrostatic capacitance C. In particular, the noise coming out of the IC through the power supply pins 17 and 19 is absorbed by the capacitive device C and disappears. The noise will therefore not affect the input circuits 11 through the power supply pins 16 and 18. As shown in FIG. 8, a counter-noise circuit can be installed outside the package. This has the advantage of obviating the necessity of installing a counter-noise circuit within the package.

In the first embodiment, the seven pairs of power supply pins 17 and 19 supply power to the internal circuits 12 and output circuits 13. Since the power lines 21 and 23 are shared by the internal circuits 12 and output circuits 13, the operating power for the internal circuits 12 becomes more affluent. Furthermore, since the plurality of input circuits 11 share the power supply pins 16 and 18, an increase in the number of power supply pins can be prevented.

In the first embodiment, power supply to the plurality of input circuits 11 is achieved by way of the common power supply pins and power line. Various variants can be configured. An embodiment in which the power supply to input circuits is modified will be described below.

Figure 9:
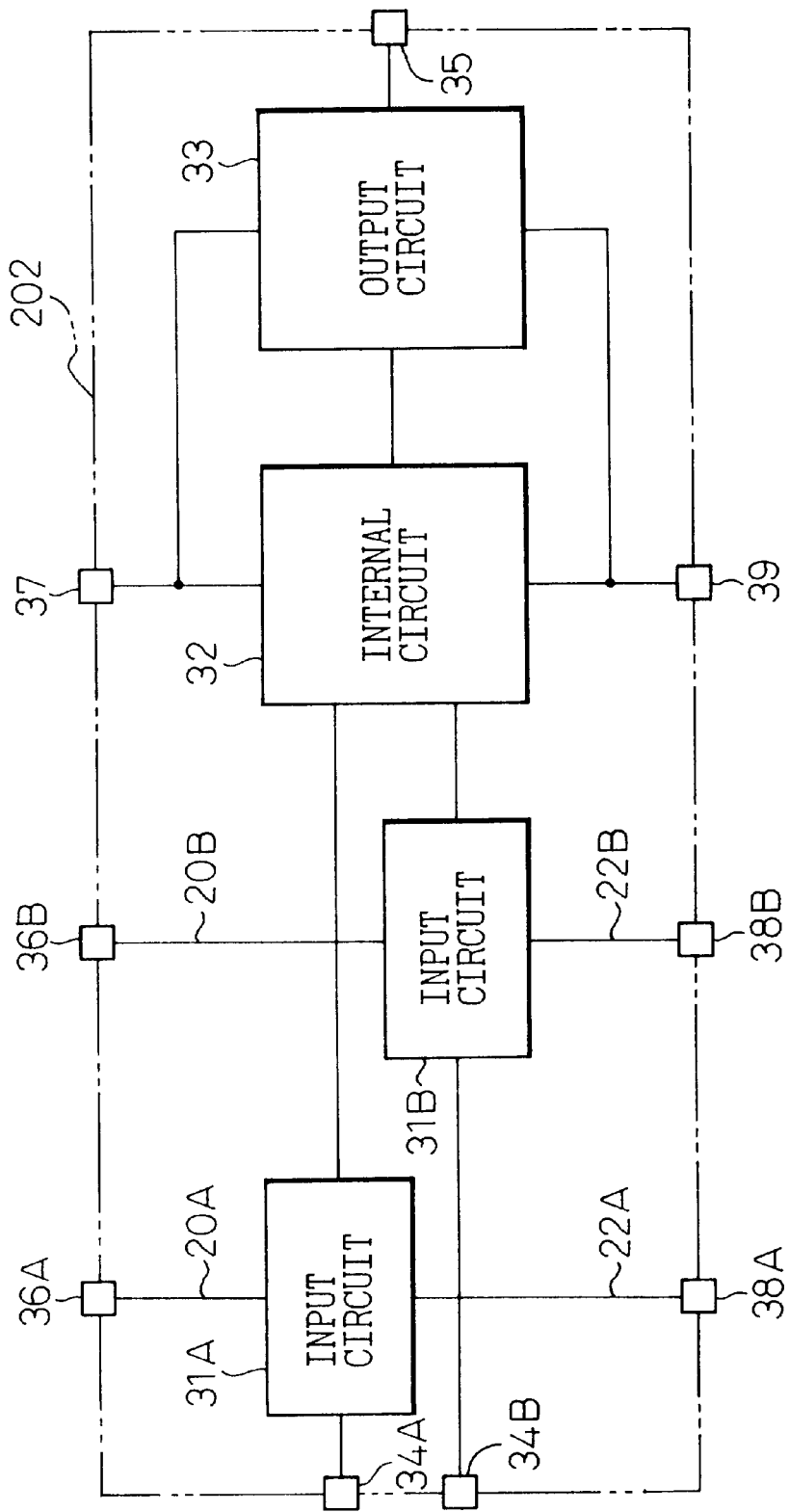
FIG. 9 is a diagram showing the configuration of a semiconductor integrated circuit of the second embodiment of the present invention.

FIG. 9 is a diagram showing the configuration of an IC of the second embodiment. As is apparent from comparison with FIG. 7, a difference from the first embodiment lies in that in an IC 200 of the second embodiment, power supply to a plurality of input circuits 31A and 31B is achieved by way of independent separate power lines.

In the IC 200 of the second embodiment, power supply to the input circuit 31A is achieved through a high-potential power supply pin 36A and ground pin 38A, while power supply to the input circuit 31B is achieved through a high-potential power supply pin 36B and ground pin 38B. If eight pair of power supply pins are included, though they are not shown in FIG. 9, power supply to an internal circuit 32 and output circuit 33 is carried out through the remaining six pairs of power supply pins.

Like the IC of the first embodiment, the IC of the second embodiment can prevent a noise generated by the output circuit 33 from propagating to the input circuits 31A and 31B within the package. Furthermore, since the power supply pins 36A and 38A for the input circuit 31A are separated from the power supply pins 36B and 38B for the input circuit 31B, a larger current can be supply to the input circuits 31A and 31B. When current consumptions of the input circuits 31A and 31B are large, the configuration of the second embodiment is preferable.

Figure 10:
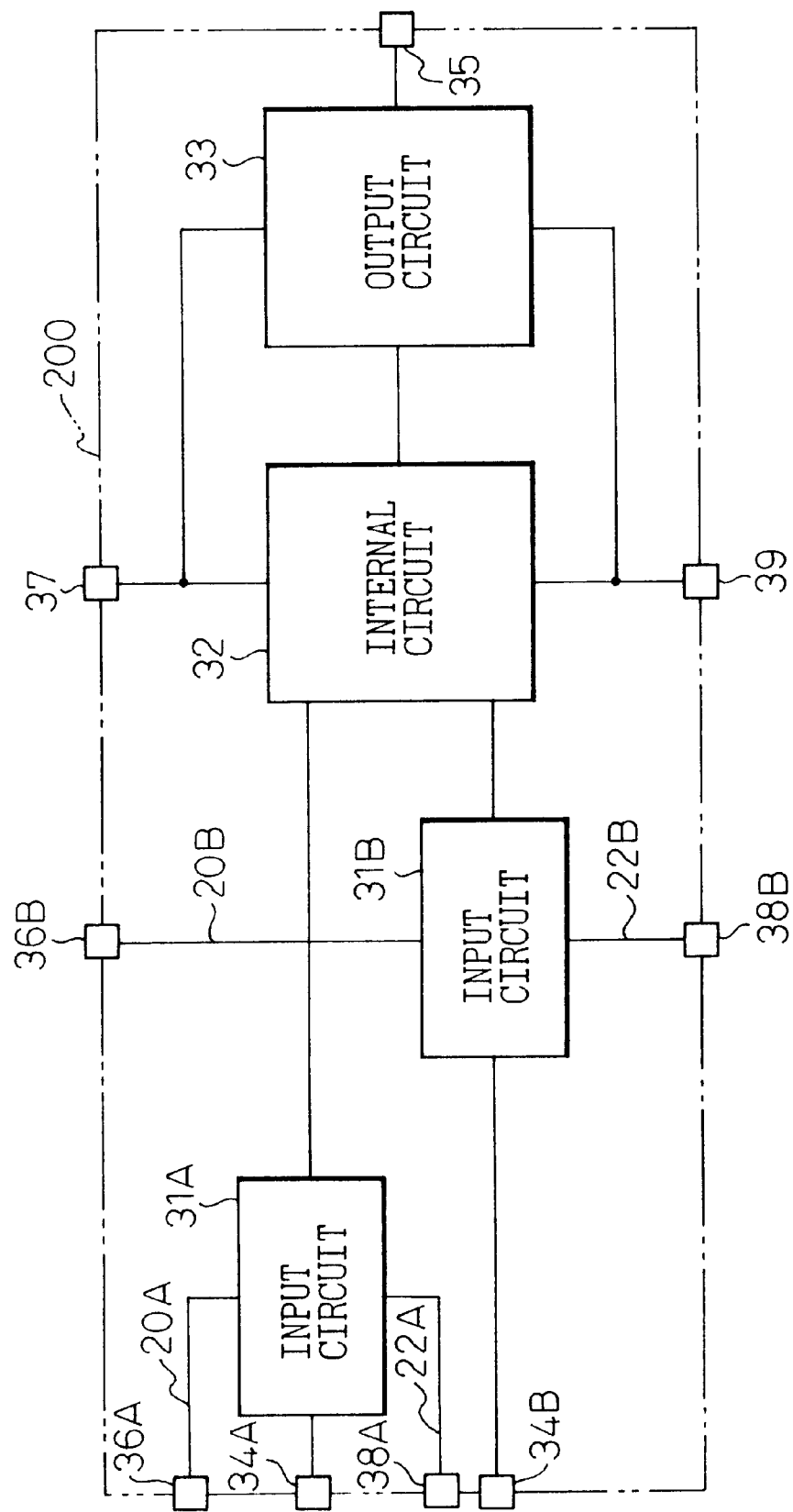
FIG. 10 is a diagram showing the configuration of a semiconductor integrated circuit of the third embodiment of the present invention.

FIG. 10 shows the configuration of an IC of the third embodiment of the present invention. The IC of the third embodiment is different from the one of the second embodiment in a point that power supply pins are arranged to exert the effect of screening a signal input pin.

As shown in FIG. 10, in an IC 200 of the third embodiment, a high-potential power supply pin 36A and ground pin 38A for an input circuit 31A are arranged across a signal input pin 34A for an input circuit 31A. Owing to this arrangement, even when power supply pins for an output circuit 33 that becomes a noise source are arranged near the signal input pin 34, input circuit power lines 20A and 22A work to screen the signal input pin from a noise stemming from the power supply pins for the output circuit 33. The IC of the third embodiment can therefore hinder a noise from entering the input circuit 31A. In FIG. 10, only an input signal line routed to the input circuit 31A is screened. Alternatively, an input signal line routed to the input circuit 31B may also be screened.

Figure 11:
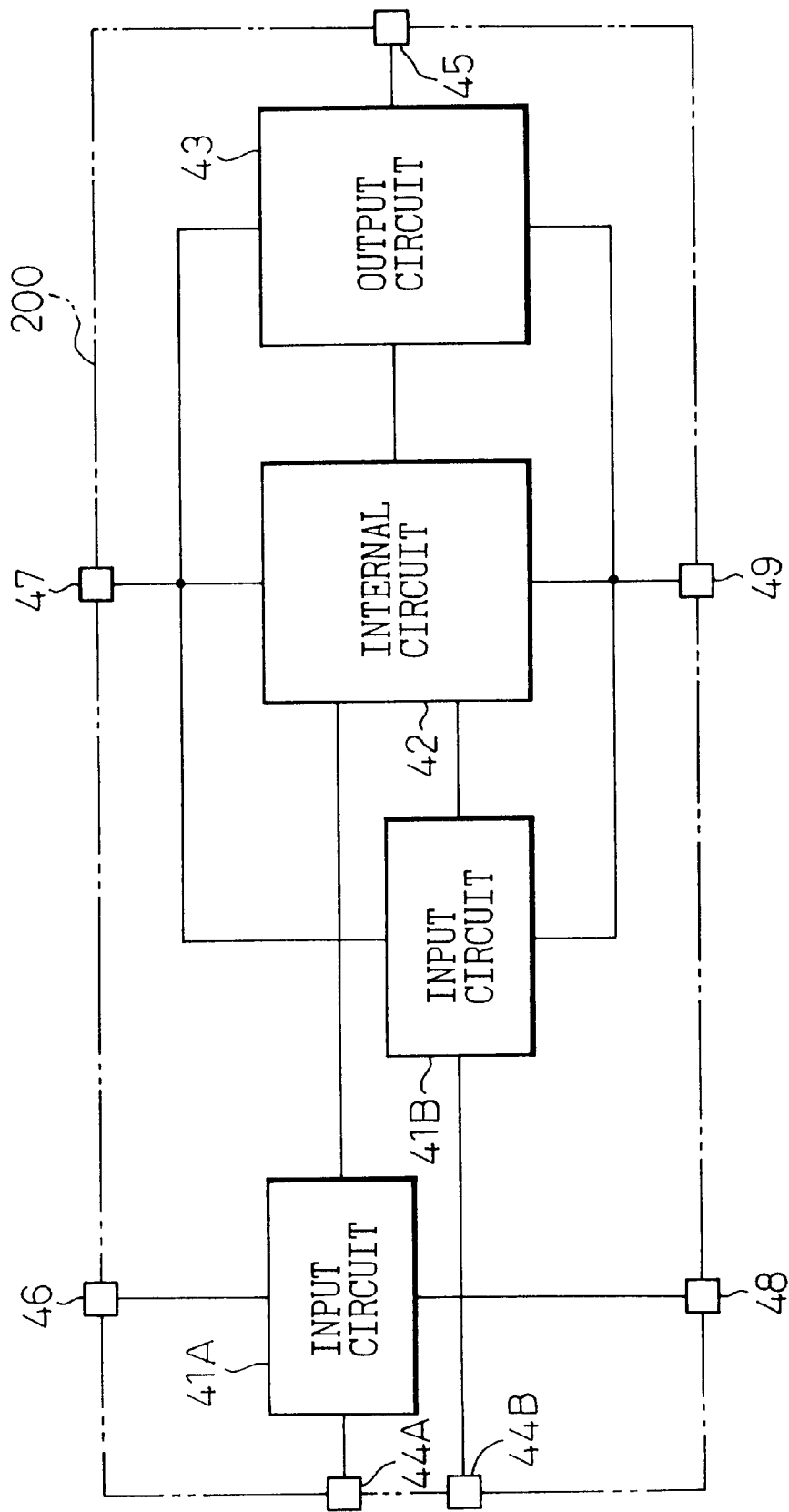
FIG. 11 is a diagram showing the configuration of a semiconductor integrated circuit of the fourth embodiment of the present invention.

FIG. 11 shows the configuration of an IC of the fourth embodiment. The IC of the fourth embodiment is different from the one of the second embodiment in a point that an input circuit 41A, to which power is supplied over separate power lines, and an input circuit 41B, to which power is supplied over general power lines in the same manner as power is supplied to an internal circuit 42 and output circuit 43, coexist. Input signals include a signal slightly durable against a noise and a signal quite durable against a noise. The signal slightly durable against a noise is therefore input to the input circuit 41A to which power is supplied over the separate power lines, while the signal quite durable against a noise is input to the input circuit 41B to which power is supplied over the general power lines.

Using the configuration of the fourth embodiment, power lines can be shared by the input circuit 41B, internal circuit 42, and output circuit 43. The power lines routed to the internal circuit can therefore be reinforced.

Figure 12A:
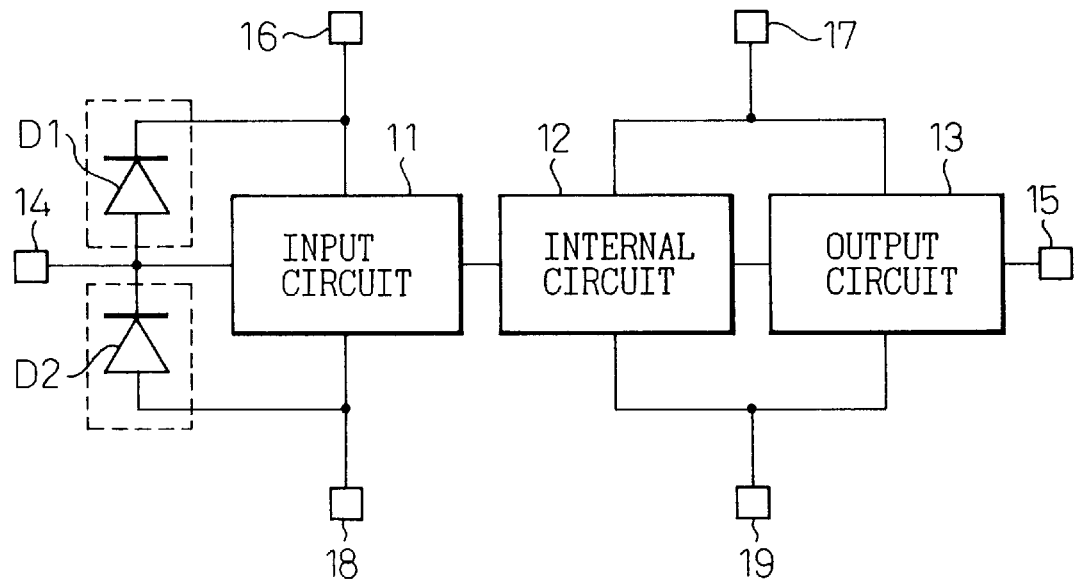
FIGS. 12A and 12B are diagrams showing the configuration of a semiconductor integrated circuit of the fifth embodiment of the present invention.
Figure 12B:
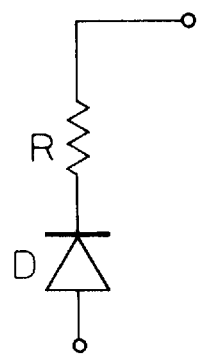

FIGS. 12A and 12B show the configuration of an IC of the fifth embodiment. The IC of the fifth embodiment is substantially identical to the one of the first embodiment except that diodes D1 and D2 acting as a protective circuit are interposed between a signal path from a signal input pin 14 to an input circuit 11 and power lines routed to the input circuit 11.

The diodes D1 and D2 constitute an example of a protective circuit, and operate to expel abnormal charge accumulated in the input pin 14 onto the power lines. As shown in FIG. 12A, the diode D1 is connected between a signal path from the signal input pin 14 to the input circuit 11 and a high-potential power line routed to the input circuit 11. The diode D1 operates to expel a positive charge accumulated in the signal input pin 14 into a high-potential power supply pin 16. The diode D2 is connected between a signal path from the signal input pin 14 to the input circuit 11 and a low-potential power line routed to the input circuit 11. The diode D2 operates to expel a negative charge accumulated in the input pin 14 into a ground pin 19. FIG. 12B shows another example of a protective circuit made by connecting a resistor R in series with a diode D. The resistor R functions to reduce a charge.

In the IC of the fifth embodiment, when abnormal charge is accumulated in the input pin 14, the diode D1 operates to expel a positive charge onto the power line and power supply pin 16, and the diode D2 operates to expel a negative charge onto the ground line and ground pin 19. Thus, the input circuit 11 can be protected from abnormal charge. Eventually, electrostatic breakdown of the input circuit 11 can be prevented. Moreover, a range of voltages of an input signal to be fed to the IC is predefined. If an input signal exceeding the voltage range is input for some reason, the signal is expelled to the high-potential power supply pin or ground pin over the power line. Thus, the input circuit is protected.

Figure 13:
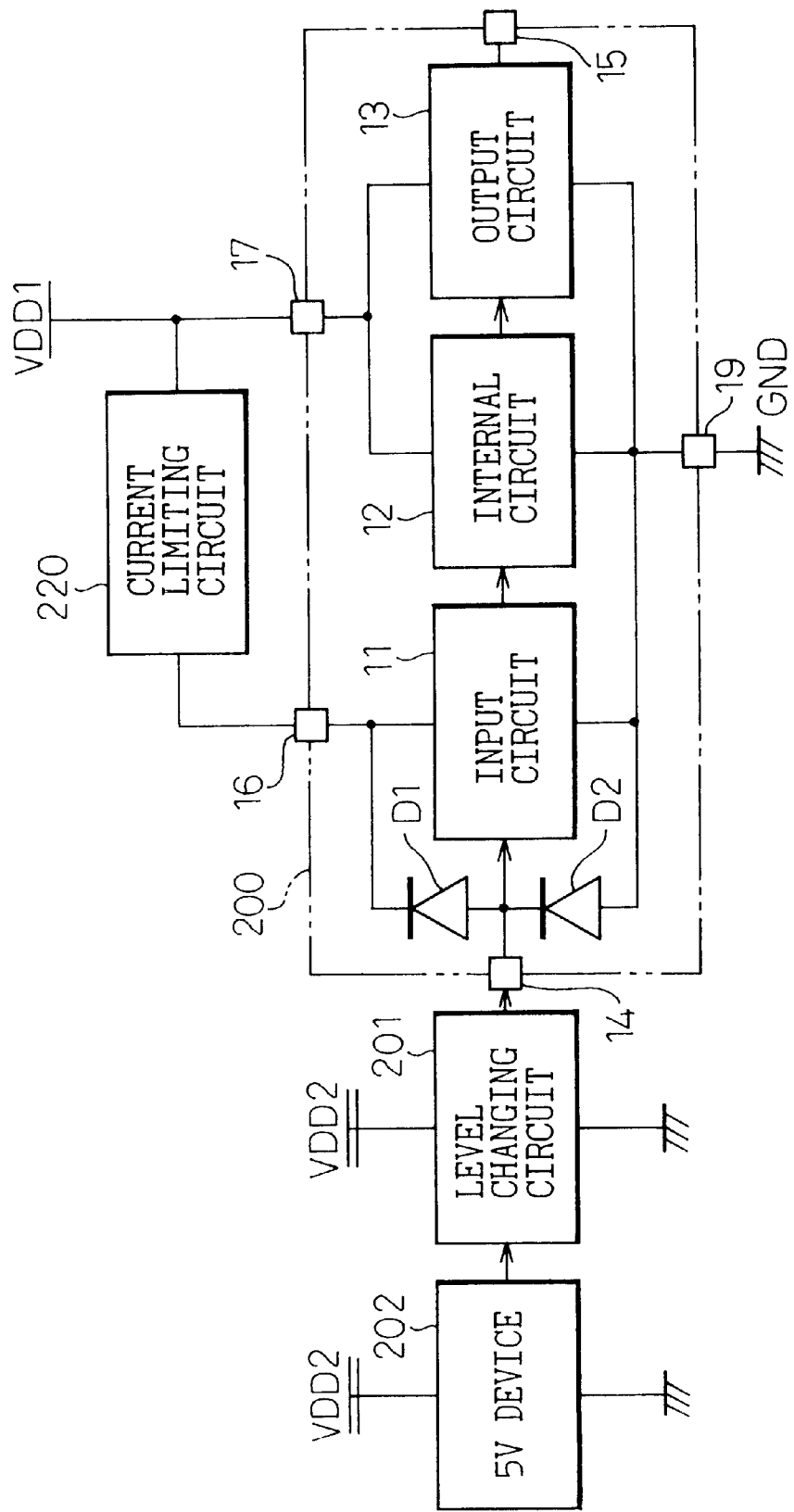
FIG. 13 is a diagram showing an example of a configuration in which the semiconductor integrated circuit of the fifth embodiment is employed.

FIG. 13 shows an example of usage of the IC of the fifth embodiment in which the IC of the fifth embodiment is connected to an IC to be driven with a high voltage. As already described, ICs to be driven with 5 V and ICs to be driven with 3.3 V may be used in combination. In this case, level conversion is required to match a signal sent from an IC with a logic level adopted by another IC. The example shown in FIG. 13 is an example of usage of the IC of the fifth embodiment in this way. An output of a 5 V-driven device 202 is converted into a signal level adopted by a 3.3 V-driven device by means of a level changing circuit 201, and then input to the 3.3 V-driven device 200. The high-potential power supply pins of the 5 V-driven device 202 and level changing circuit 201 are connected to a 5 V high-potential power supply VDD2, while the low-potential power supply pins thereof are grounded. The 3.3 V-driven device 200 is the IC of the fifth embodiment of the present invention. A high-potential power supply pin 17 is connected directly to a 3.3 V high-potential power supply VDD1, and a high-potential power supply pin 16 is connected to the power supply VDD1 via a current limiting circuit 220. A low-potential power supply pin 19 is grounded. The current limiting circuit 220 is connected between the high-potential power supply pin 16 for an input circuit of the 3.3 V-driven device 200 and the 3.3 V high-potential power supply VDD1.

The current limiting circuit 220 includes a resistor and coil. The coil is used when the frequency of a noise generated by an output circuit 13 is high. The resistance and inductance are determined according to a current consumption of an input circuit 11. In general, the current consumption of the input circuit 11 is smaller than those of an internal circuit 12 and the output circuit 13. Therefore, even if the current limiting circuit 220 is connected between the power supply pins 16 and 17, the operation of the input circuit will not be hindered. In other words, once the impedance of the current limiting circuit 220 is sufficiently reduced, a voltage drop (or voltage rise) becomes so small as to give no trouble in practice. The operation of the input circuit 1 will not be affected at all. For example, the simplest example of the current limiting circuit 220 is a sole electrical resistor. A resistor providing several ohms to several hundreds of ohms can be employed. If the power consumption of the input circuit 11 ranges from several milliamperes to several microamperes, a voltage drop occurring in the current limiting circuit 220 during a normal operation ranges from several millivolts to several tens of millivolts. The voltage drop actually poses no problem relative to the supply voltage 3.3 V.

When the IC of the fifth embodiment is used in the form shown in FIG. 13, as described in conjunction with FIG. 6, if the power supply VDD1 that is a 3.3 V source should be turned OFF for some reason, a current flowing from the level changing circuit 101 through the signal input pin 14 to a diode D1 is limited. The diode D1 and input circuit 11 can therefore be protected. In this example, the configuration in which the 5 V-driven device and 3.3 V-driven device coexist has been described. Even when devices requiring the same driving voltage are interconnected, the same advantage as the aforesaid one can be provided. Depending on a combination of supply voltages, connecting the current limiting circuit 220 to a low-potential power supply may be more effective.

Figure 14:
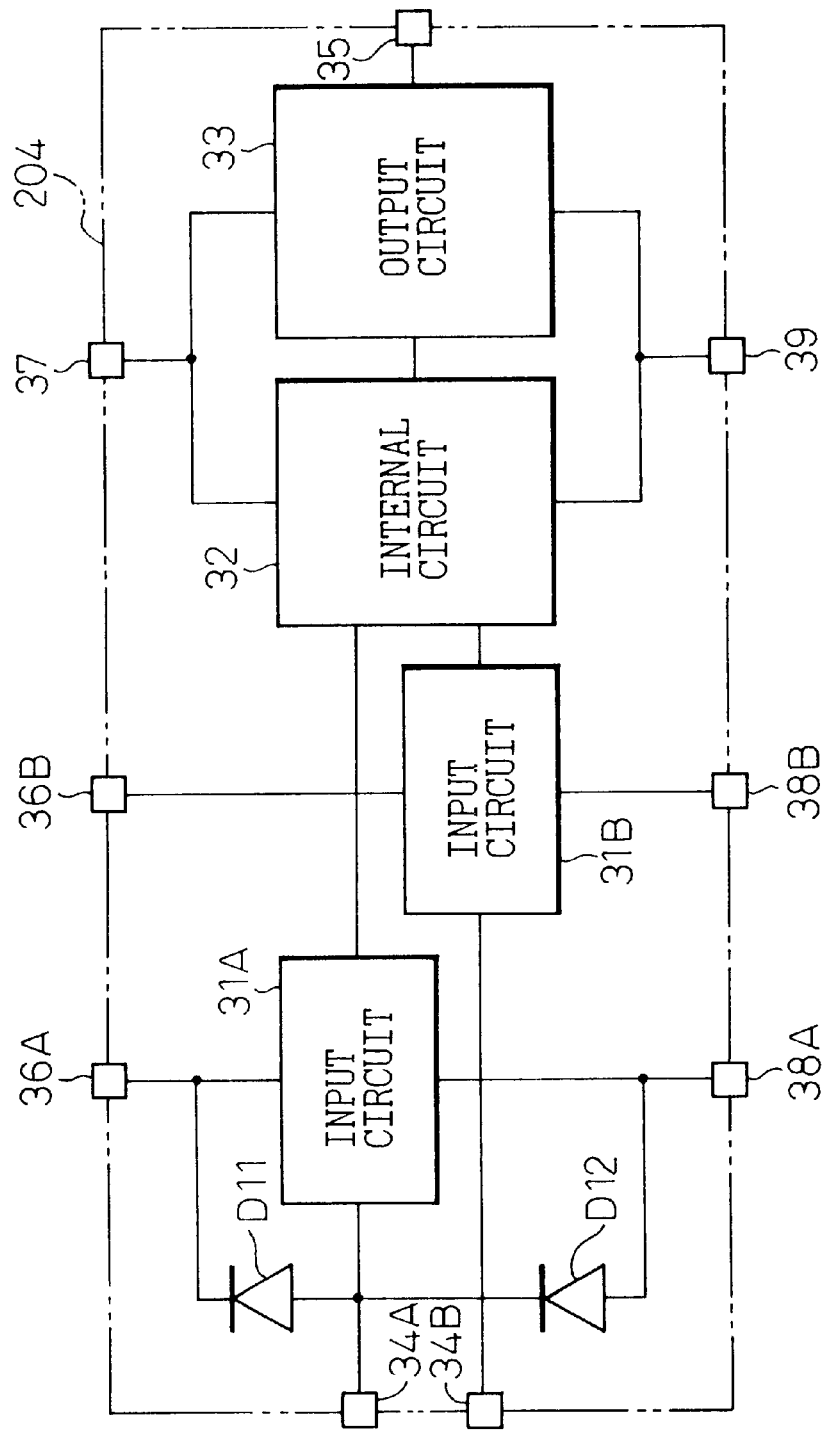
FIG. 14 is a diagram showing the configuration of a semiconductor integrated circuit of the sixth embodiment of the present invention.

FIG. 14 shows the configuration of an IC of the sixth embodiment. The IC of the sixth embodiment is substantially identical to the one of the second embodiment shown in FIG. 9 except that diodes D11 and D12 acting as a protective circuit are interposed between a signal path from a signal input pin 34A to an input circuit 31A and power lines routed to the input circuit 31A. Especially for handling a signal that is predicted to vary greatly and has a high possibility of exceeding a defined range of voltages, the protective circuit may be included in this way. Needless to say, the protective circuit may be connected to all input circuits on a one-to-one basis.

Figure 15:
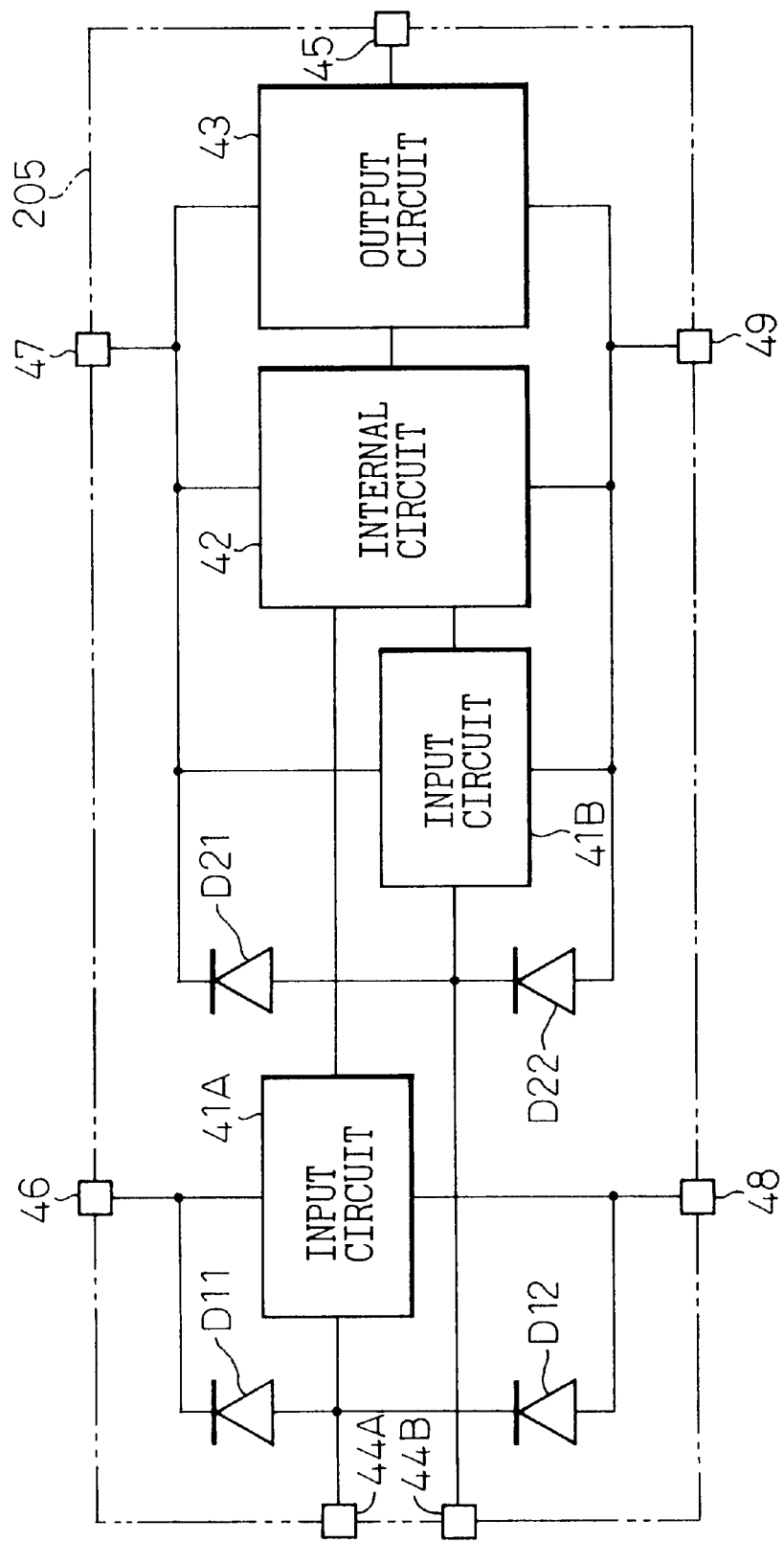
FIG. 15 is a diagram showing the configuration of a semiconductor integrated circuit of the seventh embodiment of the present invention.

FIG. 15 shows the configuration of an IC of the seventh embodiment. The IC of the seventh embodiment is substantially identical to the one of the third embodiment shown in FIG. 10 except that a protective circuit is connected to each of input circuits 41A and 41B. A diode D21 operates to expel a positive charge accumulated in a signal input pin 44B into a power supply pin 47 over a general power line, while a diode D22 operates to expel a negative charge accumulated in the signal input pin 44B to a ground pin 49 over a general ground line.

The basic configurations of the present invention have been described so far. An actual example of an IC in which the present invention is implemented will be described.

Figure 16:
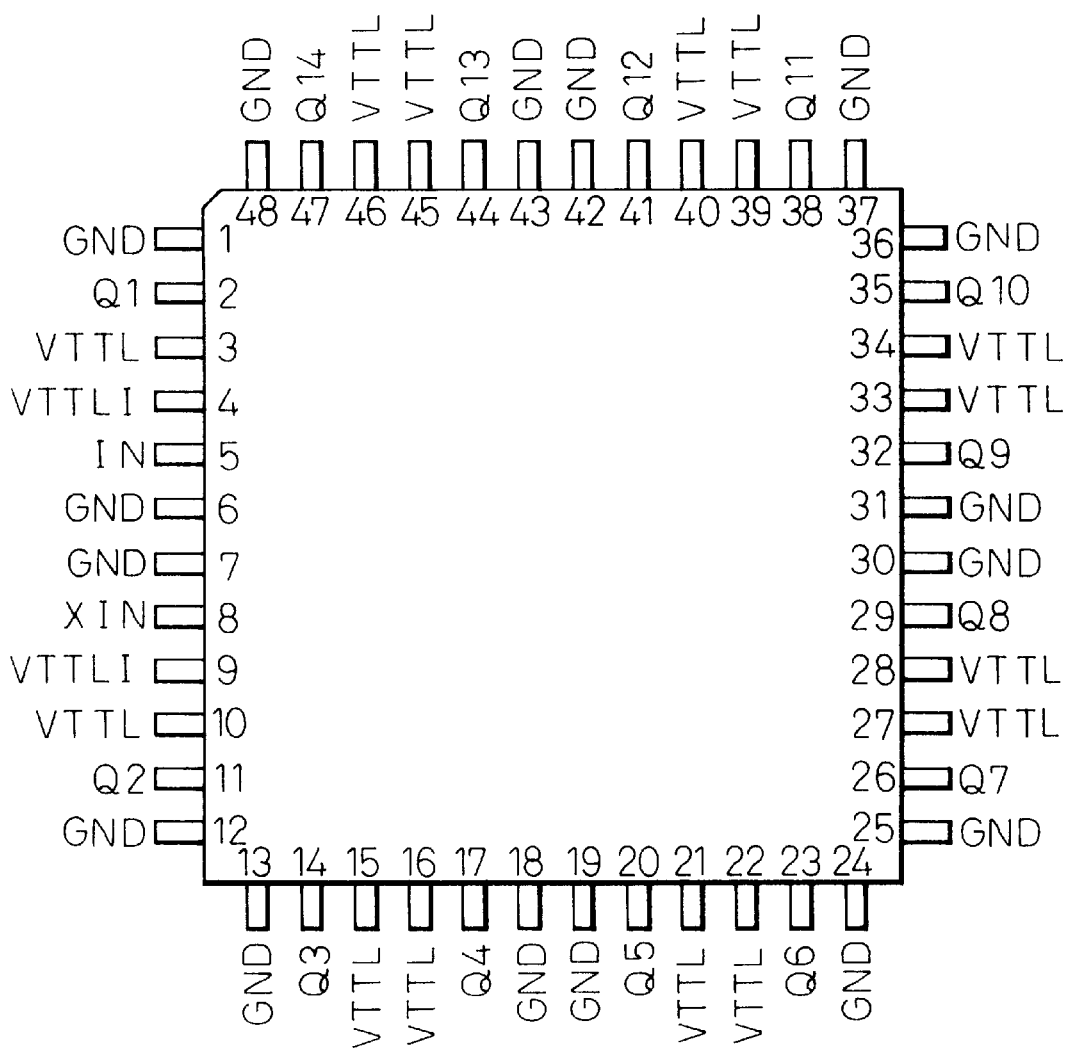
FIG. 16 is a diagram showing the pin configuration of a level conversion IC for converting a signal level from a PECL level to a LVTTL level to which the present invention is adapted.

FIG. 16 shows the pin configuration of an IC for converting a signal representing a differential PECL level, to which the present invention is adapted, into a signal representing a LVTTL level. Signals representing differential PECL levels are input through pins of Nos. 5 and 6. Level conversion is carried out within the IC. Resultant signals representing LVTTL levels are output through pins of Nos. 2, 11, 14, 17, 20, 23, 26, 29, 32, 35, 38, 41, 44, and 47. Pins of Nos. 3, 4, 9, 10, 15, 16, 21, 22, 27, 28, 33, 34, 39, 40, 45, and 46 are high-potential power supply pins, and 3.3 V is applied to all the pins. The other pins of Nos. 1, 6, 7, 12, 13, 18, 19, 24, 25, 30, 31, 36, 37, 42, 43, and 48 are ground pins, and are all grounded.

The pins of Nos. 4 and 9 among all the high-potential power supply pins are coupled to a high-potential power line routed to input circuits. The other high-potential power supply pins and ground pins are internally coupled in common to general power lines. Thus, in this IC, the same voltage is applied to the power supply pins. Internally, the power lines for input circuits are separated from the general power lines for other circuits. As apparent from FIG. 16, the pins of Nos. 5 and 6 that are signal input pins are sandwiched by the power supply pins for input circuits.

Figure 17A:
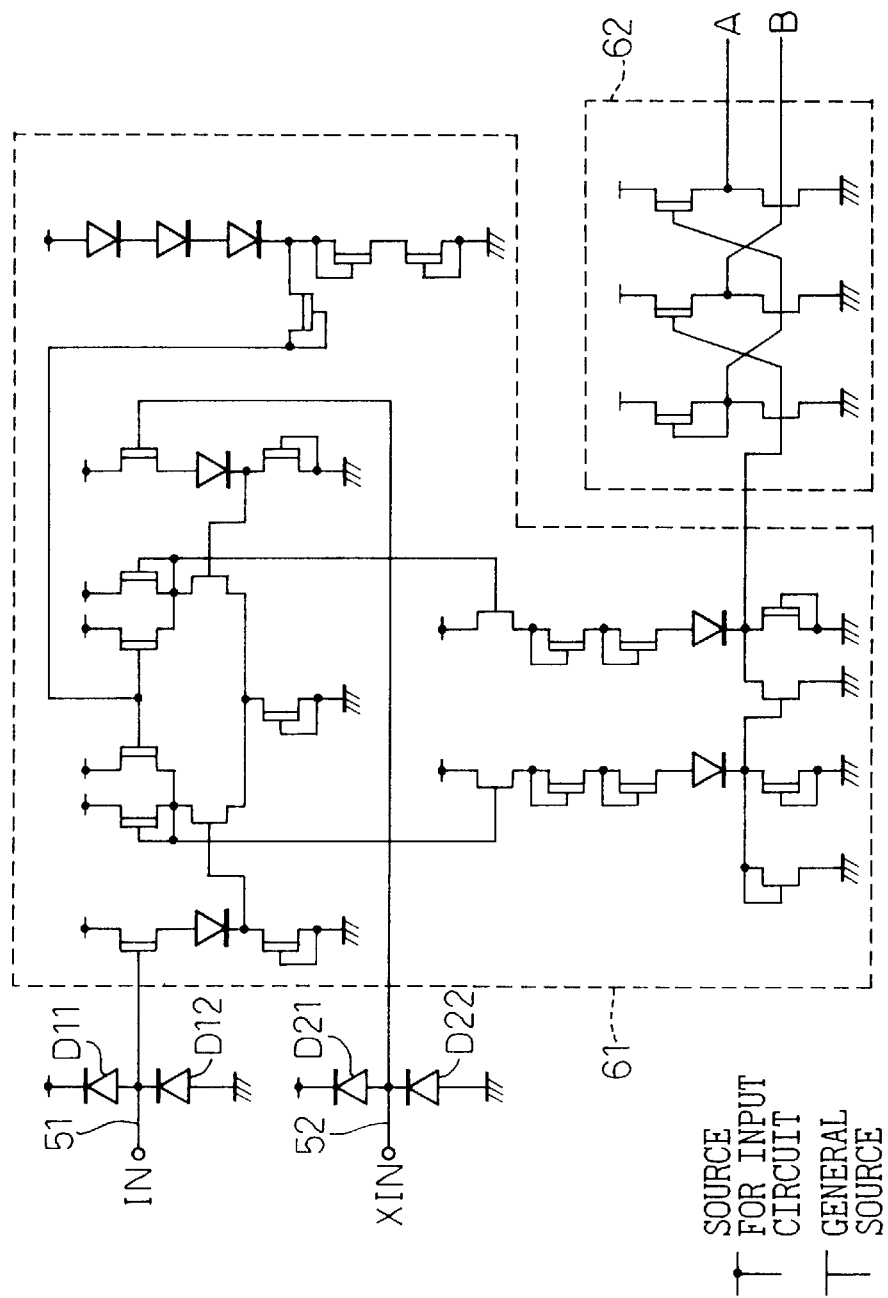
FIGS. 17A and 17B are diagrams showing the circuitry of the level conversion IC for converting a signal level from the PECL level to the LVTTL level to which the present invention is adapted.
Figure 17B:
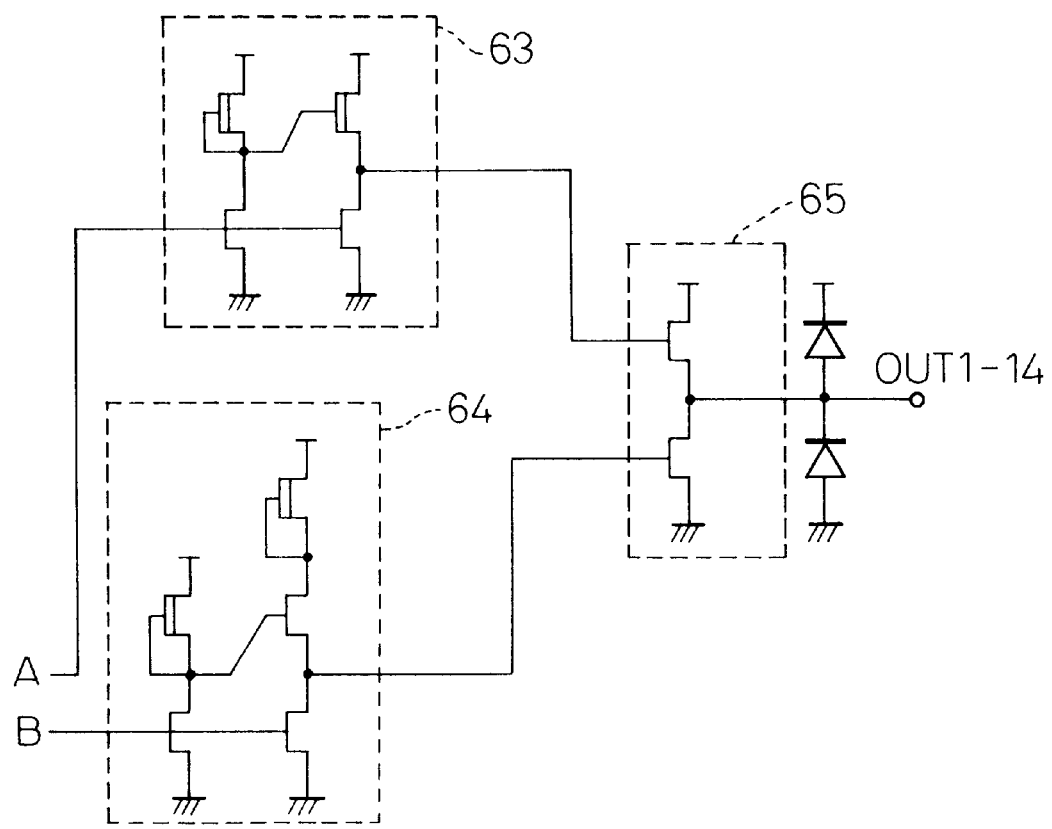

FIGS. 17A and 17B shows the circuitry of the foregoing IC. The diodes D11 and D21 constituting different protective circuits and being connected on input signal lines 51 and 52 that are coupled to signal input pins are connected on a high-potential power line routed to input circuits, that is, a power line coupled to the pins of Nos. 4 and 9. The diodes D12 and D22 are connected on a low-potential power line routed to input circuits, that is, a ground line coupled to the pins of Nos. 6 and 7. A circuit 61 is an input buffer. Power is supplied to this circuit over the power lines routed to input circuits. Circuits 62, 63, and 64 are internal circuits. A circuit 65 corresponds to an output circuit. Power is supply to these circuits over the general power lines. The detailed operations of the circuits have no direct relation to the present invention. The description of the operations will be omitted.

As described so far, in a semiconductor integrated circuit of the present invention, the power lines for an input circuit are separated from those for other circuits. It can therefore be prevented that a noise caused by other circuits propagate to the input circuit.

In a circuit unit using a semiconductor integrated circuit of the present invention provided with a protective circuit, when a current limiting circuit is connected externally to the semiconductor integrated circuit, a current likely to flow from another circuit through the protective circuit onto a power line can a be limited. The protective circuit, input circuit, and power line can be protected. Consequently, a semiconductor integrated circuit unit with high reliability can be provided.

What is claimed is:

1. A semiconductor integrated circuit, on a single chip comprising:
   an input circuit;
   an internal circuit;
   an output circuit; and
   a plurality of power supply pins through which a supply voltage, external to said chip, is supplied to said input circuit, said internal circuit and said output circuit, the same supply voltage being applied to said plurality of power supply pins,
   wherein general power lines, connected between corresponding power supply pins and said internal circuit and said output circuit, over which power is supplied to said internal circuit and said output circuit are connected to each other; and
   input power lines which are connected only between corresponding power supply pins and said input circuit and over which power is supplied to at least part of said input circuit are distinct from said general power lines.

2. A semiconductor integrated circuit according to claim 1, wherein except a circuit included in said input circuit which is connected on said input power lines, remaining circuits included in said semiconductor integrated circuit are connected to said general power lines.

3. A semiconductor integrated circuit according to claim 1, wherein either of high-potential power lines and low-potential power lines of said input power lines and general power lines are separated from each other, and the other lines are provided as a common line.

4. A semiconductor integrated circuit according to claim 2, wherein either of high-potential power lines and low-potential power lines of said input power lines and general power lines are separated from each other, and the other lines are provided as a common line.

5. A semiconductor integrated circuit according to claim 1, wherein two power supply pins, to which a high-potential power line and a low-potential power line of said input power lines are coupled, are arranged on opposite sides of said chip.

6. A semiconductor integrated circuit according to claim 2, wherein two power supply pins, to which a high-potential power line and a low-potential power line of said input power lines are coupled, are arranged on opposite sides of said chip.

7. A semiconductor integrated circuit according to claim 3, wherein two power supply pins, to which a high-potential power line and a low-potential power line of said input power lines are coupled, are arranged on opposite sides of said chip.

8. A semiconductor integrated circuit according to claim 4, wherein two power supply pins, to which a high-potential power line and a low-potential power line of said input power lines are coupled, are arranged opposed to a pin to which an input signal line routed to said input circuit is coupled.

9. A semiconductor integrated circuit according to claim 1, further comprising a protective circuit formed between said input signal line routed to said input circuit and said input power lines.

10. A semiconductor integrated circuit according to claim 2, further comprising a protective circuit formed between said input signal line routed to said input circuit and said input power lines.

11. A semiconductor integrated circuit according to claim 3, further comprising a protective circuit formed between said input signal line routed to said input circuit and said input power lines.

12. A semiconductor integrated circuit according to claim 4, further comprising a protective circuit formed between said input signal line routed to said input circuit and said input power lines.

13. A semiconductor integrated circuit according to claim 5, further comprising a protective circuit formed between said input signal line routed to said input circuit and said input power lines.

14. A semiconductor integrated circuit according to claim 6, further comprising a protective circuit formed between said input signal line routed to said input circuit and said input power lines.

15. A semiconductor integrated circuit according to claim 7, further comprising a protective circuit formed between said input signal line routed to said input circuit and said input power lines.

16. A semiconductor integrated circuit according to claim 8, further comprising a protective circuit formed between said input signal line routed to said input circuit and said input power lines.

17. A circuit unit, comprising:

a semiconductor integrated circuit on a single chip comprising an input circuit, an internal circuit and an output circuit, and a plurality of power supply pins through which a supply voltage, external to said chip, is supplied to said input circuit, said internal circuit and said output circuit and to which the same supply voltage is applied, wherein general power lines connected between corresponding power supply pins and said internal circuit and said output circuit, over which power is supplied to said internal circuit and said output circuit are connected to each other, and input power lines which are connected only between corresponding power supply pins and said input circuit over which power is supplied to at least part of said input circuit are distinct from said general power lines;

a voltage source, connected to said power supply pins of said semiconductor integrated circuit, for supplying a supply voltage to said semiconductor integrated circuit; and a current limiting circuit connected between power supply pins to which said input power lines are coupled and said voltage source.

* * * * *